(12) United States Patent
Gyoten et al.

(10) Patent No.: US 9,705,281 B2
(45) Date of Patent: Jul. 11, 2017

(54) SEMICONDUCTOR LIGHT SOURCE DRIVING APPARATUS

(71) Applicant: Panasonic Intellectual Property Management Co., Ltd., Osaka (JP)

(72) Inventors: Takaaki Gyoten, Hyogo (JP); Shinji Miyoshi, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 15/227,245

(22) Filed: Aug. 3, 2016

(65) Prior Publication Data

US 2017/0040770 A1 Feb. 9, 2017

(30) Foreign Application Priority Data

Aug. 6, 2015 (JP) ................. 2015-155733

(51) Int. Cl.
*H05B 37/00* (2006.01)
*H01S 5/042* (2006.01)
*H01S 5/40* (2006.01)
*H05B 37/02* (2006.01)

(52) U.S. Cl.
CPC .......... *H01S 5/0428* (2013.01); *H01S 5/4025* (2013.01); *H05B 37/02* (2013.01); *H01S 5/0427* (2013.01); *H01S 5/4018* (2013.01)

(58) Field of Classification Search
CPC ..... H01S 5/0428; H01S 5/4025; H05B 37/03; H05B 41/2851; H05B 41/2853; H05B 41/2855; H05B 41/2858

USPC ............ 315/119, 121–123, 125–128, 209 R, 315/224–225, 291, 294, 297, 306–308, 315/310, 312–313
See application file for complete search history.

(56) References Cited

U.S. PATENT DOCUMENTS

| 8,564,155 B2 * | 10/2013 | Wibben | ............... H02M 3/158 |
| | | | 307/31 |
| 2002/0117979 A1 * | 8/2002 | Roh | ...................... H04N 3/185 |
| | | | 315/364 |
| 2004/0124889 A1 | 7/2004 | Koharagi et al. | |

(Continued)

FOREIGN PATENT DOCUMENTS

JP 2004-147435 A 5/2004
JP 2014-531755 A 11/2014

*Primary Examiner* — Jason M Crawford
(74) *Attorney, Agent, or Firm* — McDermott Will & Emery LLP

(57) ABSTRACT

A semiconductor light source driving apparatus of the present disclosure includes a switching power supply that supplies a DC voltage, a power source switching FET, a coil, an inverting FET driver, a semiconductor light source device, and a free-wheeling diode. The power source switching FET switches on/off an output of a positive terminal of the switching power supply in accordance with an input PWM signal. The coil has a first end connected to the output of the power source switching FET. The inverting FET driver is connected between a second end of the coil and a negative terminal of the switching power supply and switched on/off in accordance with an input signal. The semiconductor light source device is connected between the second end of the coil and the negative terminal of the switching power supply. The first end of the coil and the negative terminal of the switching power supply are connected to the free-wheeling diode.

13 Claims, 5 Drawing Sheets

(56) References Cited

U.S. PATENT DOCUMENTS

| | | | |
|---|---|---|---|
| 2007/0103951 A1* | 5/2007 | Ishikawa | H02M 7/003 363/146 |
| 2009/0231552 A1* | 9/2009 | Huber | H05B 33/0857 353/85 |
| 2013/0038234 A1* | 2/2013 | Van Der Veen | H05B 33/083 315/224 |
| 2014/0217913 A1 | 8/2014 | Heeringa | |
| 2015/0312983 A1* | 10/2015 | Hu | F21K 9/1355 315/186 |

* cited by examiner

Current FED to semiconductor light source by semiconductor light source driving apparatus in exemplary embodiment Current FED to semiconductor light source by rectangular voltage driver

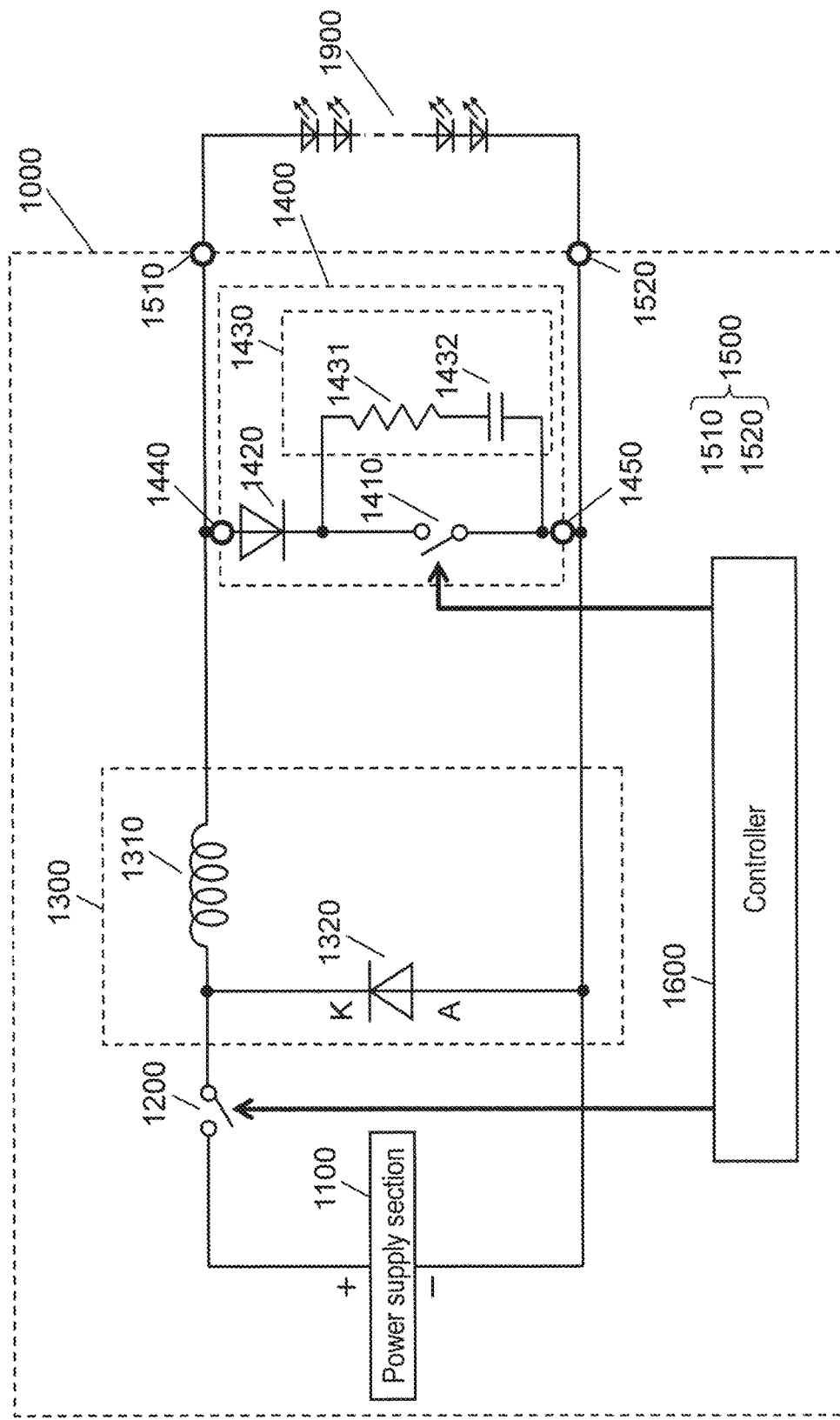

SEMICONDUCTOR LIGHT SOURCE DRIVING APPARATUS

RELATED APPLICATIONS

This application claims the benefit of Japanese Application No. 7015-155733, filed on Aug. 6, 2015, the disclosure of which is incorporated by reference herein.

BACKGROUND

1. Technical Field

The present disclosure relates to a semiconductor light source driving apparatus that supplies a semiconductor light source with a drive current that has been subjected to a high-speed pulse width modulation.

2. Description of Related Art

Unexamined Japanese Patent Publication No. 2004-147435 discloses a circuit for driving LEDs (Light Emitting Diode) or other light emitting devices. This drive circuit outputs a constant pulse current by reducing influences of temperature fluctuations and an unstable source voltage, and variations in properties of the light emitting devices.

The above light emitting device drive circuit that drives LEDs, for example, includes a switch, error signal generating means, signal retaining means, and switching power supply control means. The switch intermittently supplies power from a switching power supply to a driven target. The error signal generating means generates error signals representative of errors between a target signal and detected signals output from detection means that detects a current flowing through the driven target and generates the detected signals in accordance with the detection results. When the switch is in the ON state, the signal retaining means averages the error signals generated by the error signal generating means. When the switch is switched from the ON state to the OFF state, the signal retaining means retains the averaged error signal. Then, when the switch is switched from the OFF state to the ON state, the signal retaining means sets the signal level of the retained error signal as an initial signal level and starts to average error signals again. In the switch-off state, the switching power supply control means stops the supply of power from the switching power supply to the driven target. In the switch-on state, the switching power supply control means supplies power from the switching power supply to the driven target while controlling the amount of the power in accordance with the averaged error signal obtained from the signal retaining means.

The above configuration can provide a drive circuit that outputs a constant pulse current by reducing influences of temperature fluctuations, an unstable source voltage, and variations in device properties.

SUMMARY

The present disclosure provides a semiconductor light source driving apparatus that has high power-efficiency and can drive a semiconductor light source with a pulse width modulation current of which waveform is an accurate rectangular waveform.

A semiconductor light source driving apparatus of the present disclosure includes a switching power supply that supplies a DC voltage, a first switching device, an inductor, a second switching device, a semiconductor light source device, and a free-wheeling diode. The first switching device switches on/off an output of a positive terminal of the switching power supply in accordance with an input signal. The inductor has a first end connected to an output of the first switching device. The second switching device is connected between a second end of the inductor and a negative terminal of the switching power supply and is switched on/off in accordance with an input signal. The semiconductor light source device is connected between the second end of the inductor and the negative terminal of the switching power supply. The free-wheeling diode is connected between the first end of the inductor and the negative terminal of the switching power supply.

The present disclosure is effective in providing a semiconductor light source driving apparatus that has high power efficiency and can drive a semiconductor light source with a pulse width modulation current of which waveform is an accurate rectangular waveform.

BRIEF DESCRIPTION OF DRAWINGS

FIG. 4 is a schematic view of a semiconductor light source driving apparatus in the exemplary embodiment.

DETAILED DESCRIPTION

Some exemplary embodiments will be described below in detail with appropriate reference to the accompanying drawings. Hereinafter, excessive details of exemplary embodiments will not be described. For example, details of a known matter and configurations similar to those described already will not be described. The reason is to prevent excessively redundant descriptions from inhibiting an understanding of those skilled in the art.

The accompanying drawings and the following descriptions are given to help those skilled in the art understand the present disclosure and therefore not intended to limit the subject matters described in the claims.

Exemplary Embodiment

An exemplary embodiment will be described below with reference to FIG. 1 to FIG. 3B.

1. Configuration

Figure 1:
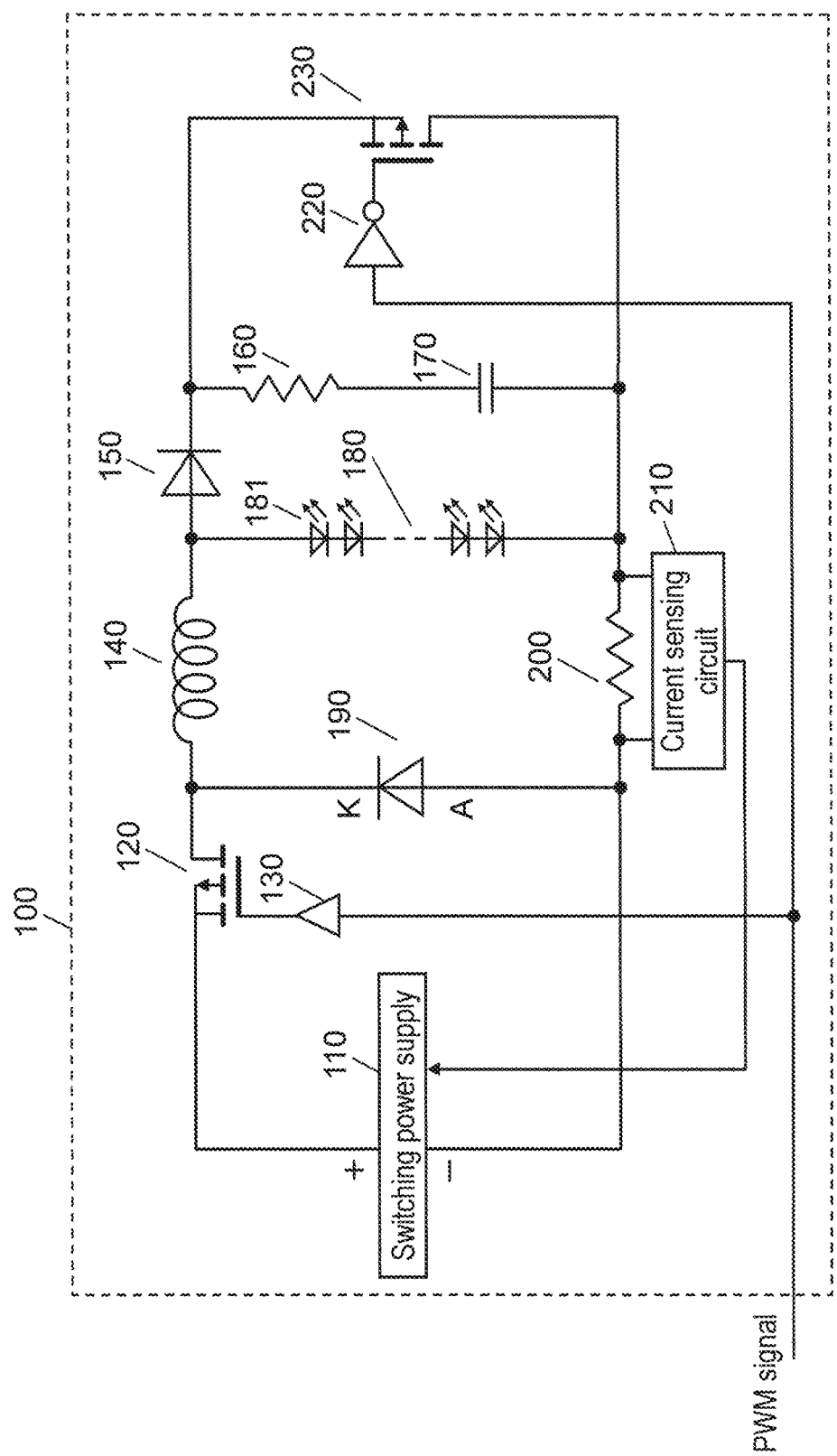
FIG. 1 is a block diagram illustrating a configuration of a semiconductor light source driving apparatus in an exemplary embodiment.

FIG. 1 is a block diagram illustrating a configuration of a semiconductor light source driving apparatus in this exemplary embodiment.

Semiconductor light source driving apparatus 100 is an apparatus that receives a PWM (Pulse Width Modulation) signal and supplies semiconductor light source 180 with a drive current that has been subjected to a pulse width modulation in accordance with this PWM signal.

Switching power supply 110 supplies a DC voltage. The positive terminal (+) of switching power supply 110 is connected to the source (or the drain) of power source switching FET (field effect transistor) 120. When the PWM signal enters semiconductor light source driving apparatus 100, the PWM signal travels to the input of FET driver 130 and the input of inverting YET driver 220, details of which will be described later. The output of FET driver 130 is connected to the gate of power source switching FET 120. With these connections, the ON/OFF state of power source switching FET 120 is controlled in accordance with the PWM signal. Power source switching FET 120 intermittently outputs, from its drain (or its source), the DC voltage supplied by switching power supply 110. Herein, power source switching FET 120 is an example of a first switching device.

When receiving the PWM signal, inverting FET driver 220 inverts the PAW signal and then outputs the inverted PWM signal as a drive output. Inverting FET driver 220 drives the gate of bypass FET 230, controlling the ON/OFF state of bypass YET 230.

The drain (output) of power source switching FET 120 is connected to a first end of coil 140. Free-wheeling diode 190 is provided between the drain of power source switching FET 120 and the negative terminal (−) of switching power supply 110. The cathode K of free-wheeling diode 190 is connected to the source of power source switching FET 120, whereas the anode A of free-wheeling diode 190 is connected to the negative terminal of switching power supply 110. When power source switching FET 120 is switched off, free-wheeling diode 190 provides a bypass path along which a current flows in the direction from the negative terminal of switching power supply 110 to the output of power source switching FET 120.

Semiconductor light source 180 includes a plurality of semiconductor light source elements (semiconductor laser diode) 181 connected in series. The anode of semiconductor light source element 181 is connected to the second end of coil 140, whereas the cathode of semiconductor light source element 181 is connected to the negative terminal of switching power supply 110 through current sensing resistor 200.

While power source switching FET 120 is in the ON state, bypass FET 230 is in the OFF state. In this state, an output current of power source switching FET 120 flows through the current path of coil 140, semiconductor light source 180, current sensing resistor 200, and the negative terminal of switching power supply 110.

Surge protection diode 150 is provided between the second end of coil 140 and the drain of bypass FET 230. The anode of surge protection diode 150 is connected to the second end of coil 140, whereas the cathode of surge protection diode 150 is connected to the drain of bypass FET 230.

When power source switching FET 120 is switched off, bypass FET 230 is switched on. In this case, a current induced from energy that has been stored in coil 140 flows through the current path of the second end of coil 140, surge protection diode 150, bypass FET 230, current sensing resistor 200, free-wheeling diode 190, and the first end of coil 140.

A snubber circuit is connected between the drain and source of bypass FET 230, that is, connected to bypass FET 230 in parallel. The snubber circuit includes snubber resistor 160 and capacitor 170 connected in series.

As described above, both surge protection diode 150 and the snubber circuit, in which snubber resistor 160 and capacitor 170 are connected in series, are inserted into the current path of bypass FET 230 and semiconductor light source 180. Surge protection diode 150 is connected in series to bypass FET 230 and semiconductor light source 180; the snubber circuit is connected in parallel to bypass FET 230. By disposing both surge protection diode 150 and the snubber circuit in this manner, an influence that switching noise caused by bypass FET 230 exerts on semiconductor light source 180 can be reduced. Specifically, the combination of surge protection diode 150 and the snubber circuit can absorb surge voltage appearing immediately after bypass FET 230 has been switched off, thereby reducing an influence of the surge voltage upon the current flowing through semiconductor light source 180. There are cases where the resonance between the inductance of the wire, including the inner wire of bypass FET 230, and drain-source capacitance bypass FET 230 and the surge voltage appearing immediately after the switch-off of bypass FET 230 causes ringing. Even in this case, the combination of surge protection diode 150 and the snubber circuit successfully suppress the ringing.

During the OFF state of bypass FET 230, a nearly equal amount of current flows through both semiconductor light source 180 and current sensing resistor 200. Current sensing circuit 210 amplifies a voltage across current sensing resistor 200 and detects a current flowing through current sensing resistor 200 from the amplified voltage. Based on this detection result, current sensing circuit 210 controls switching power supply 110 and stabilize current flow through semiconductor light source 180.

2. Operation

A description will be given below of an operation of semiconductor light source driving apparatus 100 configured above.

Figure 2A:
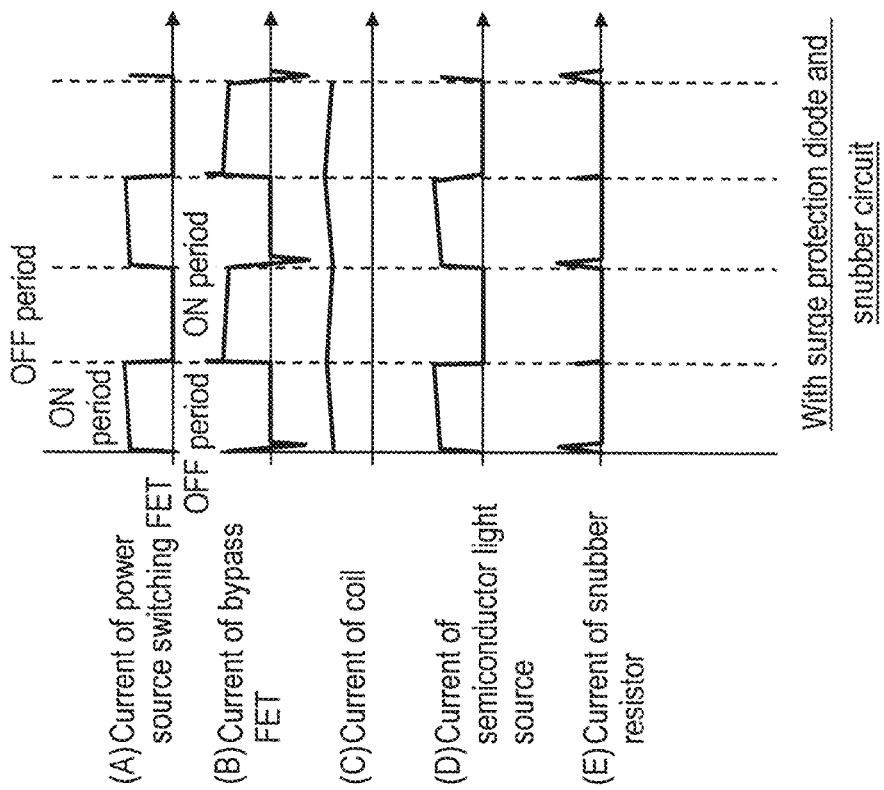
FIG. 2A is a diagram illustrating the waveforms in predetermined sections of a semiconductor light source driving apparatus that does not have a surge protection diode and a snubber circuit.
Figure 2B:
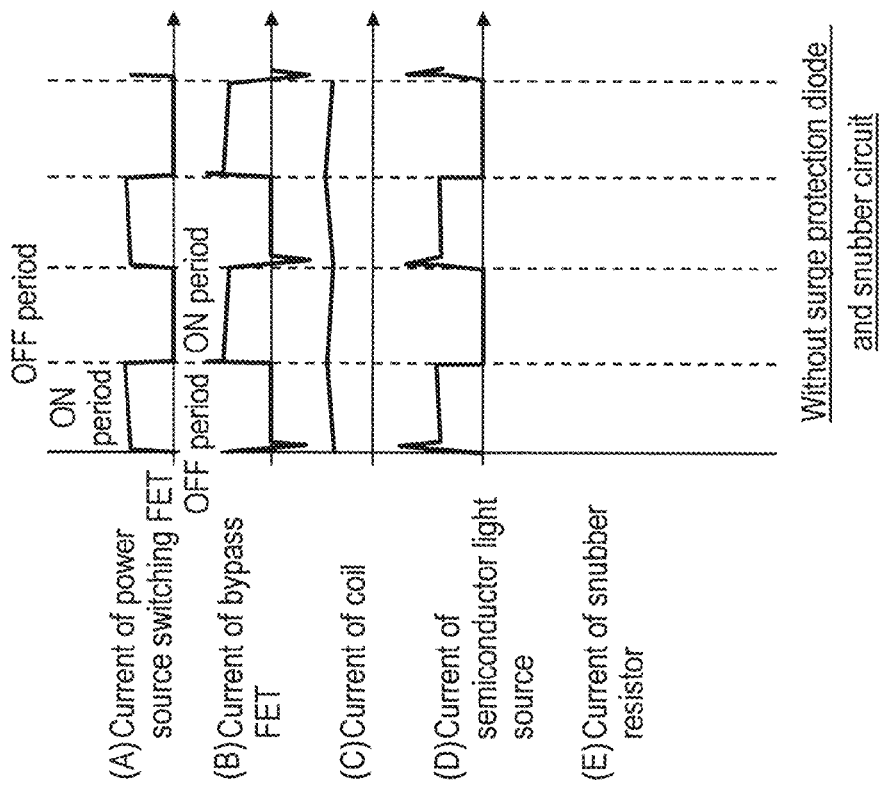
FIG. 2B is a diagram illustrating the waveforms in the predetermined sections of the semiconductor light source driving apparatus in the exemplary embodiment.

FIG. 2A illustrates time-domain waveforms in predetermined sections in a semiconductor light source driving apparatus that does not have a surge protection diode and a snubber circuit. The circuit of the semiconductor light source driving apparatus associated with the waveforms in FIG. 2A is equivalent to that of the semiconductor light source driving apparatus 100 illustrated in FIG. 1 from which surge protection diode 150, snubber resistor 160, and capacitor 170 are removed. FIG. 2B illustrates time-domain waveforms in the predetermined sections of semiconductor light source driving apparatus 100 in this exemplary embodiment. In FIG. 2A and FIG. 2B, the horizontal axis represents a time; the vertical axis represents a current value. In each of FIG. 2A and FIG. 2B, a duty cycle (ON time ratio) of PWM input signal to the semiconductor light source driving apparatus is set to 50%.

Switching power supply 110 supplies a DC voltage as a source voltage for semiconductor light source driving apparatus 100. A PWM signal enters FET driver 130, and then the output of FET driver 130 is supplied to the gate of power source switching FET 120. Thus, the ON/OFF state of power source switching FET 120 is controlled in accordance with the PWM signal. As above, PWM signal controls power source switching FET 120 to output the supplied voltage at the positive terminal of switching power supply 110 or not.

The PWM signal also enters inverting FET driver 220 in addition to semiconductor light source driving apparatus 100. Inverting FET driver 220 switches on/off bypass FET 230, based on the PWM signal. More specifically, when receiving the PWM signal, the inverting FET driver 220 inverts and amplifies the PWM signal and outputs the inverted, amplified PWM signal. When power source switching YET 120 is switched on, bypass FET 230 is switched off, whereas when power source switching FET 120 is switched off, bypass FET 230 is switched on.

While power source switching FET 120 is in the ON state and thus bypass FET 230 is in the OFF state, switching power supply 110 applies the voltage to series circuit having coil 140, semiconductor light source 180, and current sensing resistor 200. If current sensing resistor 200 has a small resistance, the series circuit to which switching power supply 110 applies the voltage can be regarded as a series circuit having only coil 140 and semiconductor light source 180.

The voltage applied by switching power supply 110 is controlled depending on a current value detected by both current sensing resistor 200 and current sensing circuit 210. In this case, transient response of the voltage applied by switching power supply 110 is much slower than the period of the PWM signal. Therefore, the voltage of switching power supply 110 converges to a certain value that enables the difference between a target current value and the average of current values detected by both current sensing resistor 200 and current sensing circuit 210 to become zero.

The state in which the difference between a target current value and the average of current values detected by both current sensing resistor 200 and current sensing circuit 210 is zero is referred to as the steady-state. When power source switching FET 120 is switched on in the steady-state, the voltage at the output terminal of power source switching FET 120 exceeds the forward voltage of semiconductor light source 180. In this case, the voltage is applied to coil 140 so that a current flowing through coil 140 increases by an amount corresponding to the difference between the output voltage of switching power supply 110 and the forward voltage of semiconductor light source 180. Referring to FIG. 2A and FIG. 2B, the current of the power source switching FET indicates that the current flowing through coil 140 (coil current) increases at the ratio of the voltage applied to coil 140 to the inductance of coil 140. In this case, a nearly equal amount of current flows through both coil 140 and the semiconductor light source, because when power source switching FET 120 is in the ON state, bypass FET 230 is in the OFF state. As described above, when power source switching FET 120 is switched on in the steady-state, a current flowing through the semiconductor light source increases. If the inductance of coil 140 increases, the above ratio decreases. In other words, the ratio is inversely proportional to the inductance of coil 140.

When power source switching FET 120 is switched from the ON state to the OFF state and thus bypass FET 230 is switched from the OFF state to the ON state, the current flowing through coil 140 changes slowly. In response to this, the current flowing through free-wheeling diode 190 increases by an amount corresponding to the decrease in the current flowing through power source switching FET 120.

When bypass FET 230 is switched off, the current that has flown out from coil 140 flows into current sensing resistor 200 through semiconductor source 180. When bypass FET 230 is switched on, the current that has flown out from coil 140 flows into current sensing resistor 200 through surge protection diode 150 and bypass FET 230. The time required to switch between the paths of the current flowing out from coil 140 depends on the time over which bypass FET 230 is switched on. As bypass FET 230 can perform a high-speed switching, the current path changes quickly from the current path having semiconductor light source 180 to the current path not having semiconductor light source 180.

When power source switching FET 120 is switched off and bypass FET 230 is switched on, the energy stored in coil 140 is gradually decreased by the resistance of coil 140, the on-resistance of bypass FET 230, the current sensing resistor 200, the forward voltage of free-wheeling diode 190, the forward voltage of surge protection diode 150, and the resistance of the wire. In short, as illustrated in FIG. 2A and FIG. 2B, the current that has flown out from coil 140 (coil current) gradually decreases over the period in which power source switching FET 120 is in the OFF state.

When power source switching FET 120 is switched from the OFF state to the ON state and thus bypass FET 230 is switched from the ON state to the OFF state, the current flowing into the source of bypass FET 230 decreases. In this case, the current may excessively decrease to have a negative value. In response to the switching of bypass FET 230, the inductance of the wire, the parasitic inductance of bypass FET 230, and the capacitance between the drain and source of bypass FET 230 may induce resonance. Furthermore, a rapid change in the potential at the gate of bypass FET 230 may cause a charge injection from the gate to source of bypass FET 230. When surge protection diode 150, snubber resistor 160, and capacitor 170 are not provided, noise current, which is caused by the switching of bypass FET 230, flows into semiconductor light source 180, thereby making it difficult to control an amount of current flowing through semiconductor light source 180. Referring to FIG. 2A, the current of the semiconductor light source indicates that the current flowing through semiconductor light source 180 may be doubled transiently at the switching timing of bypass FET 230.

As illustrated in FIG. 2B, providing surge protection diode 150, snubber resistor 160, and capacitor 170 can suppress noise current caused by the switching of bypass FET 230 from flowing into semiconductor light source 180. Surge protection diode 150 blocks a current flow from the source of bypass FET 230 to semiconductor light source 180. The snubber circuit including capacitor 170 and snubber resistor 160 absorbs noise current caused by the switching of bypass FET 230, and attenuates ringing of the noise current.

Figure 3A:
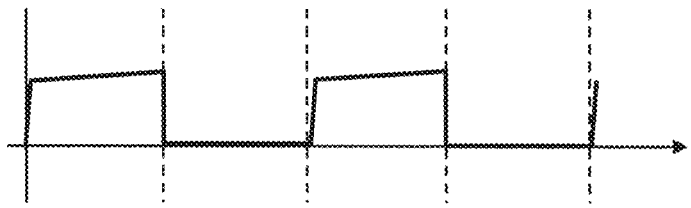
FIG. 3A is a diagram illustrating the waveform of a current flowing through a semiconductor light source driven by the semiconductor light source driving apparatus in the exemplary embodiment.
Figure 3B:
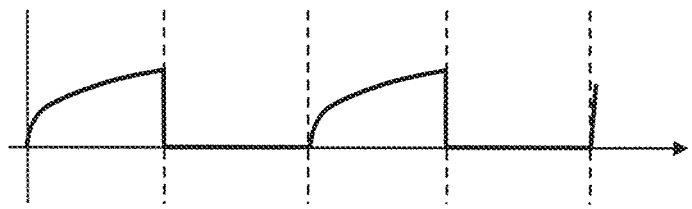
FIG. 3B is a diagram illustrating the waveform of a current flowing through a semiconductor light source driven with a rectangular voltage waveform.

FIG. 3A illustrates the waveform of a current flowing through the semiconductor light source driven by the semiconductor light source driving apparatus in this exemplary embodiment. FIG. 3B illustrates the waveform of a current flowing through a semiconductor light source, when the semiconductor light source same as that shown in FIG. 3A is driven by a drive circuit that outputs a voltage of a rectangular waveform. In FIG. 3A and FIG. 3B, the horizontal axis represents a time; the vertical axis represents a current value. In FIG. 3A, a duty cycle (ON time ratio) of a PWM signal input to the semiconductor light source driving apparatus is set to 50%. In FIG. 3B, a duty cycle of a voltage waveform output from the drive circuit is also set to 50% in a rectangular form.

In general, the forward voltage of semiconductor light source 180 depends on a junction temperature of semiconductor light source elements 181. For example, each of semiconductor light source elements 181 is expected to be a laser diode. As the junction temperature of semiconductor light source elements 181 decreases, the forward voltage of semiconductor light source elements 181 increases, that is, the forward voltage of semiconductor light source 180 increases. When a current flows through semiconductor light source elements 181, the junction temperature of semiconductor light source elements 181 increases. When no current flows through semiconductor light source elements 181, heat is dissipated from semiconductor light source elements 181 and thus its junction temperature decreases. If semiconductor light source 180 is driven with a current based on a PWM signal, the junction temperature of semiconductor light source 180 becomes the lowest and the forward voltage of semiconductor light source 180 becomes the highest at the time when the current starts to flow through semiconductor light source 180. Then, as time over which the current flows through semiconductor light source 180 increases, the junction temperature of semiconductor light source element 181 increases but the forward voltage of semiconductor light source 180 decreases.

If a semiconductor light source driving apparatus that does not employ the structure of this exemplary embodiment outputs a voltage of a rectangular waveform by switching a voltage of a switching power supply between the ON state and the OFF state in accordance with a PWM signal, a current flows through the semiconductor light source with its rise time prolonged, as illustrated in FIG. 3B. This is because a constant voltage is continuously applied across the semiconductor light source. In this case, a predetermined amount of current flows through the semiconductor light source, and the small amount of the current flows at the timing at which the current starts flowing. Then the amount of the current flowing through the semiconductor light source increases with rising junction temperature.

In contrast, semiconductor light source driving apparatus 100 in this exemplary embodiment can improve degradation of a current waveform, which would be attributed to a junction temperature drop as described above. In other words, semiconductor light source driving apparatus 100 in this exemplary embodiment can feed a current to the semiconductor light source with its rise time shortened.

In this exemplary embodiment, when bypass FET 230 is switched off, a counter electromotive force induced by coil 140 acts on both ends of semiconductor light source 180. Coil 140 induces the counter electromotive force so that a current flowing through coil 140 becomes constant within a short time. Therefore, a constant amount of current keeps flowing through coil 140 before and after the switch-off of bypass FET 230, independently of the forward voltage of semiconductor light source 180. While bypass FET 230 is in the OFF state, major part of current that has flown out from coil 140 flows into semiconductor light source 180. As a result, it is possible to feed a desired amount of current to semiconductor light source 180 independently of the forward voltage of semiconductor light source 180. In this case, the amount of the output current flowing through semiconductor light source 180 is nearly equal to that flowing through coil 140 when bypass FET 230 is switched from the ON state to the OFF state.

While power source switching FET 120 is in the ON state, a voltage may be applied to the both ends of coil 140 in a direction in which the current flows through coil 140. Thus, the amount of current flowing through coil 140 is increased. However, its increasing ratio is low.

As illustrated in FIG. 3A, the semiconductor light source driving apparatus 100 in this exemplary embodiment drives semiconductor light source 180 with a current of a waveform having a sharp rising edge. Moreover, semiconductor light source driving apparatus 100 in this exemplary embodiment feeds a substantially constant amount of current to semiconductor light source 180. Therefore, it is possible to drive semiconductor light source 180 by using a current of a rectangular waveform with minimal distortions.

FIG. 4 is a schematic view of a semiconductor light source driving apparatus in the exemplary embodiment. Power supply section 1100 in FIG. 4 corresponds to switching power supply 110 in FIG. 1. First switching device 1200 in FIG. 4 corresponds to power source switching FET 120 in FIG. 1. Current flowback section 1300 in FIG. 4 includes inductor 1310 and free-wheeling diode 1320. Inductor 1310 corresponds to coil 140 in FIG. 1; free-wheeling diode 1320 corresponds to free-wheeling diode 190 in FIG. 1. Bypass section 1400 in FIG. 4 includes second switching device 1410, surge protection diode 1420, surge suppression circuit 1430, first node 1440, and second node 1450. Second switching device 1410 corresponds to bypass FET 230 in FIG. 1. Surge protection diode 1420 corresponds to surge protection diode 150 in FIG. 1. Surge suppression circuit 1430 is a snubber circuit including resistor 1431 and capacitor 1432. Resistor 1431 corresponds to snubber resistor 160 in FIG. 1; capacitor 1432 corresponds to capacitor 170 in FIG. 1. First node 1440 corresponds to the anode of surge protection diode 150 in FIG. 1; second node 1450 corresponds to the node at which capacitor 170 is connected to the drain of bypass FET 230 in FIG. 1. A pair of output terminals 1500 in FIG. 4 includes positive-side output terminal 1510 and negative-side output terminal 1520. Positive-side output terminal 1510 is related to the positive terminal of semiconductor light source driving apparatus 1100; negative-side output terminal 1520 is related to the negative terminal of power supply section 1100. Positive-side output terminal 1510 corresponds to the anode end of semiconductor light source 180 in FIG. 1; negative-side output terminal 1520 corresponds to the cathode end of semiconductor light source 180 in FIG. 1. First node 1440 of bypass section 1400 is connected to positive-side output terminal 1510; second node 1450 of bypass section 1400 is connected to negative-side output terminal 1520. Controller 1600 in FIG. 4 controls first switching device 1200 and second switching device 1410. Semiconductor light source 1900 in FIG. 4 corresponds to semiconductor light source 180 in FIG. 1. Semiconductor light source 1900 has semiconductor light source elements corresponding to semiconductor light source elements 181 in FIG. 1 and is connected to the pair of output terminals 1500 of semiconductor light source driving apparatus 1000.

Figure 5:
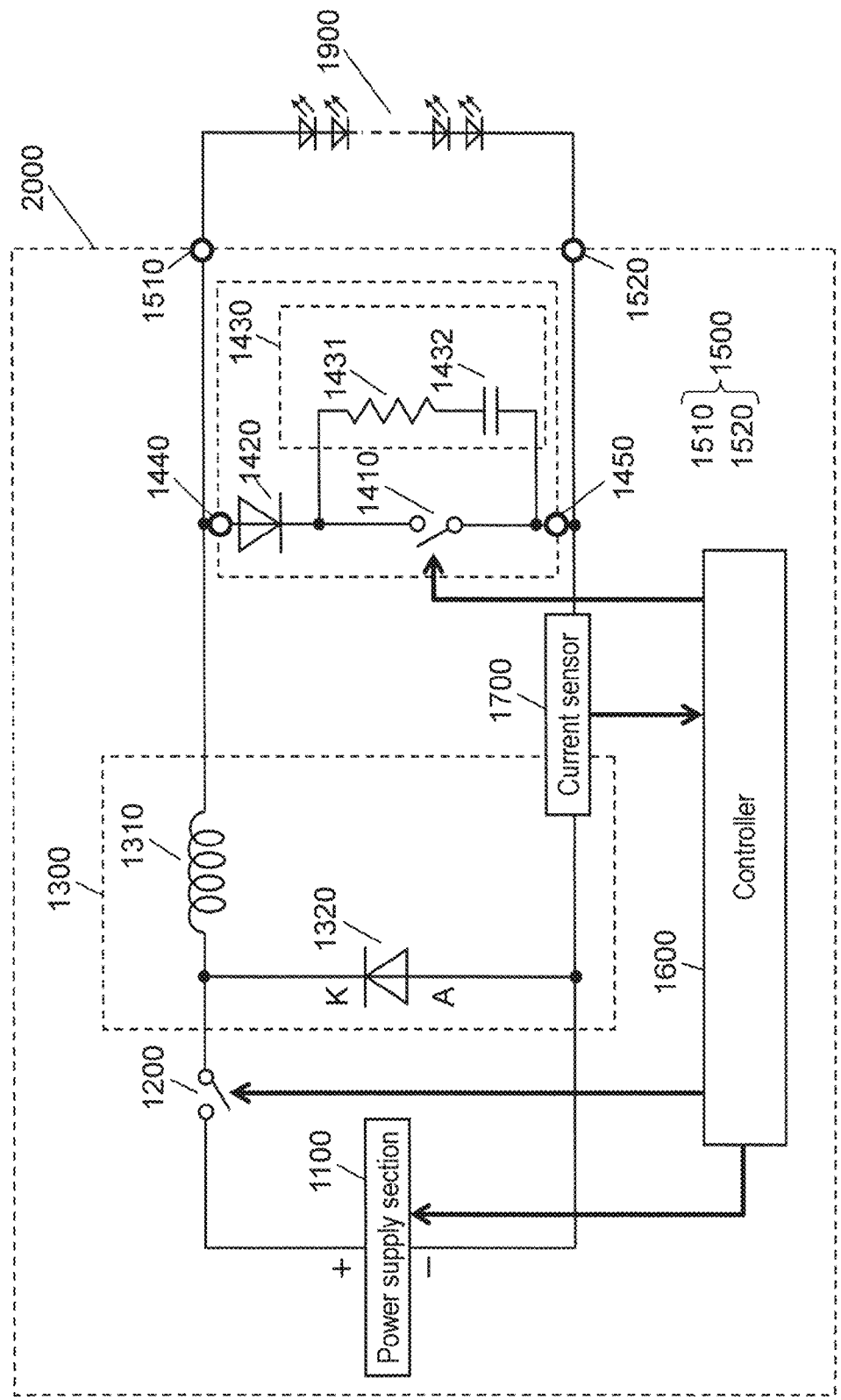
FIG. 5 is a schematic view of another semiconductor light source driving apparatus in the exemplary embodiment.

FIG. 5 is a schematic view of another semiconductor light source driving apparatus in this exemplary embodiment. Semiconductor light source driving apparatus 2000 illustrated in FIG. 5 further includes current sensor 1700 in addition to the components of semiconductor light source driving apparatus 1000 illustrated in FIG. 4. Current sensor 1700 corresponds to both current sensing resistor 200 and current sensing circuit 210 in FIG. 1. Current sensor 1700 corresponds to current sensing resistor 200 in FIG. 1, and a part of controller 1600 may correspond to current sensing circuit 210 in FIG. 1. Controller 1600 detects a current flowing through current sensor 1700 and, controls an output voltage of power supply section 1100. If a signal output from current sensor 1700 can directly control power supply section 1100, controller 1600 may be provided with a connecting section in which the output of current sensor 1700 is connected to a control terminal of power supply section 1100. The configuration in which controller 1600 is provided with the connecting section is equivalent to that in FIG. 1.

In semiconductor light source driving apparatus 1000 and semiconductor light source driving apparatus 2000, controller 1600 controls both first switching device 1200 and second switching device 1410 in accordance with a PWM signal. While second switching device 1410 is in the OFF state, that is, while a current is flowing through semiconductor light source 1900, controller 1600 controls first switching device 1200 to be kept in the ON state.

3. Effects

A semiconductor light source driving apparatus in this exemplary embodiment employs a system that switches an FET to pulse width modulate an output of a switching power supply having high power efficiency. This system has no power loss if all devices in the system operate ideally. Power loss caused by actual devices in the system is small enough related to the output power. Thus, the system can achieve high power efficiency.

While the On time of a PWM signal is 100%, that is, while semiconductor light source driving apparatus is outputting the maximum power, power source switching FET 120 is kept in the ON state. In this case, power source switching FET 120 is not switched. Therefore, the switching loss of power source switching FET 120 becomes zero, and only the on-resistance of power source switching FET 120 may contribute to the power loss. As a result, the semiconductor light source driving apparatus operates with high efficiency. More specifically, the semiconductor light source driving apparatus features a operation with the highest efficiency in the high power state, where power efficiency is required.

According to this exemplary embodiment, the semiconductor light source driving apparatus utilizes a physical phenomenon in which a coil induces a counter electromotive force so as to reduce a rapid change in the amount of the current flowing through the coil. This can reduce the risk of the current waveform being deformed due to a decrease in the junction temperature described above. Consequently, it is possible to provide a semiconductor light source driving apparatus that drives a semiconductor light source with a pulse width modulation current of which waveform is an accurate rectangular waveform.

The effects of the semiconductor light source driving apparatus illustrated in FIG. 1 will be further described with reference to FIG. 4 and FIG. 5.

In this exemplary embodiment, controller 1600 controls both first switching device 1200 and second switching device 1410, based on the same PWM signal. Thus, first switching device 1200 and second switching device 1410 are switched simultaneously so that first switching device 1200 is switched on when second switching device 1410 is switched off. While second switching device 1410 is in the OFF state, a current is flowing from inductor 1310 to semiconductor light source 1900, thereby consuming a large power. While second switching device 1410 is in the ON state, a current is flowing from inductor 1310 to bypass section 1400. Bypass section 1400 has a small resistance, and thus a low voltage is applied across both first node 1440 and second node 1450. Therefore, bypass section 1400 consumes small power. Thus, over a period of consuming a large power, power supply section 1100 supplies power through first switching device 1200. Over a period of consuming a small power, power supply section 1100 doesn't supply power. In this way, current which flows through inductor 1310 is stabilized.

In this exemplary embodiment, a PWM signal determines a proportion of an ON period of semiconductor light source 1900. If a display apparatus employs the semiconductor light source driving apparatus in this exemplary embodiment, each period of the PWM signal may be related to a corresponding pixel and each duty cycle (proportion of ON time) of the PWM signal may be related to brightness of the corresponding pixel. Each duty cycle of the PWM signal depends on the brightness of the corresponding pixels, which may be set differently, therefore the duty cycles differs in each of periods of the PWM signal. According to this exemplary embodiment, the semiconductor light source driving apparatus can use a simple configuration to stabilize current flowing through inductor 1310, when a duty cycle of a PWM signal changes.

In this exemplary embodiment, current sensor 1700 is provided such that a nearly equal amount of current flows through both current sensor 1700 and inductor 1310. In the configuration illustrated in FIG. 5, all the current that has flown out from inductor 1310 flows into current sensor 1700 regardless of whether second switching device 1410 is in the ON state or in the OFF state. The current flows through inductor 1310 so stably that current sensor 1700 can detect a value of the current without being affected by disturbance factors, including a duty cycle of a PWM signal. In this way, current sensor 1700 can detect a current value precisely with a relatively simple configuration.

In the description of this exemplary embodiment, P-channel MOSFETs are used as first switching device 1200 and second switching device 1410. However, each of first switching device 1200 and second switching device 1410 is not limited to a P-channel MOSFET and may be any element that can be switched between the ON state and the OFF state. Alternatively, for example, each of first switching device 1200 and second switching device 1410 may be an N-channel MOSFET or a combination of a plurality of elements. Needless to say, if first switching device 1200 is a P-channel MOSFET and second switching device 1410 is an N-channel MOSFET, controller 1600 does not have to drive second switching device 1410 by using an inverted signal, as opposed to the configuration in FIG. 1.

In this exemplary embodiment, surge protection diode 1420 prevents a backflow of a current from first node 1440 of bypass section 1400 to positive-side output terminal 1510. This can suppress the influence that resonance or a charge injection caused by switching of second switching device 1410 exerts on a current flowing through semiconductor light source 1900. Therefore, even if a MOSFET used as second switching device 1410 causes a charge injection, it is possible to suppress an influence of the charge injection of the MOS-FETE In this exemplary embodiment, the semiconductor light source driving apparatus drives semiconductor light source 1900 in a current mode. More specifically, a current waveform, not a voltage waveform, which has been output from the pair of output terminals 1500 is improved toward an ideal waveform. In this exemplary embodiment, a current of a substantially rectangular waveform is fed to semiconductor light source 1900 independent to a junction temperature of semiconductor light source elements.

OTHER EXEMPLARY EMBODIMENTS

The first exemplary embodiment, which is an exemplary technique disclosed in this application, has been described above. The technique in the present disclosure, however, is not limited to this exemplary embodiment and is also applicable to other exemplary embodiments that undergo appropriate modifications, substitutions, additions, omissions, and the like.

Other exemplary embodiments will be described below.

In the foregoing exemplary embodiment, a current sensing resistor is used as an exemplary current sensor. The current sensor is any sensor that can detect current. Therefore, the current sensor is not limited to the current sensing resistor. The technique using a current sensing resistor as a current sensor can be implemented at low cost. Alternatively, a hole effect sensor may be used as a current sensor. Using a hole effect sensor as a current sensor can contribute to a low power consumption.

In the foregoing exemplary embodiment, coil 140 is used as an example of inductor 1310 in current flowback section 1300; however, any other element having an appropriate inductance may be used. Alternatively, for example, a stacked inductor or an inductor which is fabricated on a semiconductor may be used.

In the foregoing exemplary embodiment, controller 1600 controls an output voltage of power supply section 1100, based on a value of a current detected by current sensor 1700; however, controller 1600 may employ any other control methods. Alternatively, for example, controller 1600 may control first switching device 1200 and second switching device 1410 independently of each other. More specifically, controller 1600 may control first switching device 1200, based on a current value detected by current sensor 1700. This control method can stabilize a detected current, detected by current sensor 1700, or a current which flows through inductor 1310.

It should be noted that the exemplary embodiments described above are exemplary techniques in the present disclosure and may undergo various modifications, substitutions, additions, omissions, and the like within the scope of the claims and their equivalents.

The present disclosure is applicable to semiconductor light source driving apparatuses that supply a current to a semiconductor light source. Specifically, exemplary applications of the present disclosure include a video projector, a television, and other display apparatuses.

What is claimed is:

1. A semiconductor light source driving apparatus comprising:
    a switching power supply that supplies a DC voltage;
    a first switching device that switches on/off an output of a positive terminal of the switching power supply in accordance with an input PWM signal;
    an inductor having a first end connected to an output of the first switching device;
    a second switching device connected between a second end of the inductor and a negative terminal of the switching power supply, the second switching device being switched on/off in accordance with an inversion of the input PWM signal;
    a semiconductor light source device connected between the second end of the inductor and the negative terminal of the switching power supply; and
    a free-wheeling diode to which the first end of the inductor and the negative terminal of the switching power supply are connected.

2. The semiconductor light source driving apparatus according to claim 1, wherein each of the first switching device and the second switching device is a field effect transistor.

3. The semiconductor light source driving apparatus according to claim 2, further comprising:
    a surge protection diode connected between the second end of the inductor and the second switching device; and
    a snubber circuit provided between a first end of the second switching device and a second end of the second switching device, the snubber circuit including a resistor and a capacitor connected in series.

4. A semiconductor light source driving apparatus that drives a semiconductor light source device, the semiconductor light source device being connected to a first output terminal of the semiconductor light source driving apparatus and to a second output terminal of the semiconductor light source driving apparatus, the semiconductor light source driving apparatus comprising:
    a power supply section that outputs a DC voltage;
    a first switching device connected to an output of the power supply section;
    a current flowback section connected to an output of the first switching device;
    a bypass section connected to an output of the current flowback section; and
    a controller that controls the first switching device and the bypass section,
    the current flowback section including:
        an inductor provided in a path connecting a first end of the power supply section to a corresponding output terminal of the first and second output terminals; and
        a free-wheeling diode having a first end connected to an input end of the inductor,
    the bypass section including:
        a first node being a first end of the bypass section, the first node being connected to a positive terminal of the first and second output terminals;
        a second node being a second end of the bypass section, the second node being connected to a negative terminal of the first and second output terminals; and
        a second switching device controlled by the controller, and
    the second switching device being provided in a path connecting the first node to the second node in the bypass section, and
    wherein the controller controls the first switching device so that the first switching device is in an ON state when the second switching device is in an OFF state.

5. The semiconductor light source driving apparatus according to claim 4, wherein the bypass section includes a surge protection diode that rectifies a current flowing between the first node and the second node so that the current flows in a direction from the first node and the second node.

6. The semiconductor light source driving apparatus according to claim 5, wherein the bypass section includes a surge suppression circuit that is provided in parallel to the second switching device.

7. The semiconductor light source driving apparatus according to claim 6, wherein the surge suppression circuit is a snubber circuit including a resistor and a capacitor connected in series.

8. The semiconductor light source driving apparatus according to claim 5, wherein the bypass section includes a surge suppression circuit that is provided in a path connecting the first node to the second node in parallel to the second switching device and in series with the surge protection diode.

9. The semiconductor light source driving apparatus according to claim 5, wherein the second switching device is a field effect transistor.

10. The semiconductor light source driving apparatus according to claim 4, wherein the bypass section includes a surge suppression circuit that is provided in parallel to the second switching device.

11. The semiconductor light source driving apparatus according to claim 10, wherein the surge suppression circuit is a snubber circuit including a resistor and a capacitor connected in series.

12. The semiconductor light source driving apparatus according to claim 4, wherein the second switching device is a field effect transistor.

13. The semiconductor light source driving apparatus according to claim 4, further comprising a current sensor,
wherein the current sensor is provided between a first end of the free-wheeling diode and one of the first and second output terminals, and the current sensor measures a current flowing through the current sensor, and
the controller controls the power supply section, based on the amount of the current detected by the current sensor.

* * * * *